(12) United States Patent
Park et al.

(10) Patent No.: US 8,507,156 B2
(45) Date of Patent: Aug. 13, 2013

(54) LASER MASK AND SEQUENTIAL LATERAL SOLIDIFICATION CRYSTALLIZATION METHOD USING THE SAME

(75) Inventors: Sun Park, Yongin (KR); Chun-Gi You, Yongin (KR); Jong-Hyun Park, Yongin (KR); Yul-Kyu Lee, Yongin (KR); Jin-Hee Kang, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 270 days.

(21) Appl. No.: 12/881,104

(22) Filed: Sep. 13, 2010

(65) Prior Publication Data
US 2011/0117731 A1     May 19, 2011

(30) Foreign Application Priority Data
Nov. 16, 2009   (KR) .......................... 10-2009-0110481

(51) Int. Cl.
*G03F 1/22* (2012.01)
(52) U.S. Cl.
USPC .............................................................. 430/5
(58) Field of Classification Search
USPC ................... 430/5, 30; 438/487, 166; 117/7, 117/8, 9
See application file for complete search history.

(56) References Cited

U.S. PATENT DOCUMENTS
2010/0019175 A1*   1/2010   Nakata ........................ 250/515.1

FOREIGN PATENT DOCUMENTS
| JP | 10-097055 | | 4/1998 |
| JP | 2000-066373 | | 3/2000 |
| JP | 2002-011589 | A | 1/2002 |
| JP | 2002-289508 | | 10/2002 |
| KR | 10-2003-0047850 | A | 6/2003 |
| KR | 10-0486676 | | 4/2005 |
| KR | 10-2006-0010560 | A | 2/2006 |

OTHER PUBLICATIONS

Korean Office Action dated Mar. 29, 2011 from Korean Patent Application No. KR 10-2009-0110481 which corresponds to the captioned application.

* cited by examiner

*Primary Examiner* — Stephen Rosasco
(74) *Attorney, Agent, or Firm* — Knobbe, Martens, Olson & Bear LLP

(57) ABSTRACT

A laser mask is disclosed. In one embodiment, the laser mask includes: a mask substrate including i) at least one light transmission portion configured to transmit light therethrough and ii) a plurality of light interruption portions separated by the light transmission portion interposed therebetween. The light interruption portions are configured to block light; and a plurality of protrusion and depression regions positioned on the light interruption portions of the mask substrate. The protrusion and depression regions comprise a plurality of concave portions and a plurality of convex portions which are alternately formed.

17 Claims, 10 Drawing Sheets

LASER MASK AND SEQUENTIAL LATERAL SOLIDIFICATION CRYSTALLIZATION METHOD USING THE SAME

CROSS-REFERENCE TO RELATED APPLICATION

This application claims priority to and the benefit of Korean Patent Application No. 10-2009-0110481 filed in the Korean Intellectual Property Office on Nov. 16, 2009, the entire contents of which are incorporated herein by reference.

BACKGROUND OF THE INVENTION

1. Field of the Invention

The present invention relates to a laser mask, and more particularly, to a laser mask for crystallizing amorphous silicon, and a sequential lateral solidification crystallization method using the same.

2. Description of the Related Technology

Recently, an organic light emitting diode (OLED) display has received much attention as a device for displaying images.

The OLED display has a self-emission characteristic, eliminating the necessity for a light source, unlike a liquid crystal display (LCD) device, and thus can be fabricated to be thinner and lighter. Also, the OLED display has high quality characteristics such as low power consumption, high luminance, a high response speed, and the like.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect is a laser mask having advantages of restraining a difference in crystallization of amorphous silicon, and a sequential lateral solidification (SLS) crystallization method using the same.

Another aspect is a laser mask including: a mask substrate having a light transmission portion and light interruption portions separated by the light transmission portion interposed therebetween; and protrusion and depression regions positioned on the mask substrate such that they correspond to the light interruption portions, and having a concavo-convex shape.

The mask substrate may further include a base substrate having a first face and a second face facing the first face, and the light interruption portions may be positioned on at least one of the first and second faces of the base substrate.

The light interruption portion may include a first sub-interruption portion positioned on the first face of the base substrate and a second sub-interruption portion positioned on the second face of the base substrate, and the protrusion and depression region may include a first sub-protrusion and depression region corresponding to the first sub-interruption portion and a second sub-protrusion and depression region corresponding to the second sub-interruption portion.

The light interruption portion may include chromium (Cr). The protrusion and depression region may include chromium (Cr). The protrusion and depression region may be integrally formed with the light interruption portion. The light interruption portion may include a heat-resistant resin.

One of the first and second sub-protrusion and depression regions may have an even concavo-convex shape, and the other may have an uneven concavo-convex shape.

The first and second sub-protrusion and depression regions may have an even concavo-convex shape. The first and second sub-protrusion and depression regions may have an uneven concavo-convex shape. The base substrate may include quartz. The laser mask may be used for SLS crystallization method.

Another aspect is an SLS crystallization method including: forming an amorphous silicon layer on an insulation substrate; disposing a laser mask, which includes a mask substrate having a light transmission portion and light interruption portions separated by the light transmission portion interposed between the light interruption portions, and protrusion and depression regions positioned on the mask substrate such that they correspond to the light interruption portions, and having a concavo-convex shape, on the amorphous silicon layer; irradiating a laser beam oscillated from a laser apparatus to the amorphous silicon layer through the laser mask; and crystallizing the amorphous silicon layer by using overlapping laser beams.

The mask substrate of the laser mask may further include a base substrate having a first face and a second face facing the first face, and the light interruption portions may be positioned on at least one of the first and second faces of the base substrate, and in irradiating the laser beam to the amorphous silicon layer through the laser mask, the laser beam irradiated to the protrusion and depression regions is diffused by the protrusion and depression regions. Another aspect is a laser mask comprising: a mask substrate comprising i) at least one light transmission portion configured to transmit light therethrough and ii) a plurality of light interruption portions separated by the light transmission portion interposed therebetween, wherein the light interruption portions are configured to block light; and a plurality of protrusion and depression regions positioned on the light interruption portions of the mask substrate, wherein the protrusion and depression regions comprise a plurality of concave portions and a plurality of convex portions which are alternately formed.

The above mask substrate further comprises a base substrate having a first surface and a second surface opposing each other, wherein the light interruption portions are positioned on at least one of the first and second surfaces of the base substrate.

In the above mask, each of the light interruption portions comprises a first sub-interruption portion positioned on the first surface of the base substrate and a second sub-interruption portion positioned on the second surface of the base substrate, wherein each of the protrusion and depression regions comprises a first sub-protrusion and depression region formed on the first sub-interruption portion and a second sub-protrusion and depression region formed on the second sub-interruption portion, and wherein the first sub-interruption portion and the second sub-protrusion and depression region are substantially directly opposing each other with respect to the base substrate.

In the above mask, each of the light interruption portions is formed of chromium (Cr). In the above mask, each of the protrusion and depression regions is formed of chromium (Cr). In the above mask, each of the protrusion and depression regions is integrally formed with the corresponding light interruption portion. In the above mask, each of the light interruption portions is formed of a heat-resistant resin. In the above mask, one of the first and second sub-protrusion and depression regions comprises concave portions and convex portions which are substantially uniformly formed, and wherein the other comprises concave portions and convex portions which are not uniformly formed.

In the above mask, the first and second sub-protrusion and depression regions comprise concave portions and convex portions which are substantially uniformly formed. In the above mask, the first and second sub-protrusion and depression regions comprise concave portions and convex portions which are not uniformly formed. In the above mask, the base substrate is formed of quartz.

In the above mask, the first sub-protrusion and depression region is formed directly above the first sub-interruption portion, and wherein the first sub-protrusion and depression region and the first sub-interruption portion have substantially the same width. In the above mask, the second sub-protrusion and depression region is formed directly below the first sub-interruption portion, and wherein the second sub-protrusion and depression region and the second sub-interruption portion have substantially the same width.

In the above mask, the mask is used for a sequential lateral solidification (SLS) crystallization method. In the above mask, the at least one light transmission portion comprises a plurality of light transmission portions, and wherein the light transmission portions and light interruption portions are substantially evenly spaced apart.

Another aspect is a sequential lateral solidification (SLS) crystallization method comprising: forming an amorphous silicon layer on an insulation substrate; disposing a laser mask, which comprises 1) a mask substrate includes i) at least one light transmission portion configured to transmit light therethrough and ii) a plurality of light interruption portions separated by the light transmission portion interposed therebetween, wherein the light interruption portions are configured to block light and 2) a plurality of protrusion and depression regions positioned on the light interruption portions of the mask substrate, wherein the protrusion and depression regions comprise a plurality of concave portions and a plurality of convex portions which are alternately formed; and irradiating a laser beam irradiated from a laser apparatus to the amorphous silicon layer through the laser mask.

The above method further comprises crystallizing the amorphous silicon layer with the use of overlapping laser beams. In the above method, the mask substrate of the laser mask further comprises a base substrate including a first surface and a second surface opposing each other, and the light interruption portions are positioned on at least one of the first and second surfaces of the base substrate, and in irradiating the laser beam to the amorphous silicon layer through the laser mask, the laser beam irradiated to the protrusion and depression regions is diffused by the protrusion and depression regions.

Another aspect is a laser mask comprising: a mask substrate comprising i) a plurality of light transmission regions configured to transmit light therethrough and ii) a plurality of light blocking regions configured to block light, wherein the light transmission regions and light blocking regions are spaced apart and alternately formed; and a plurality of concave portions and a plurality of convex portions which are alternately formed on the light blocking regions and are configured to diffuse at least part of incoming light.

In the above mask, the mask substrate comprises two opposing surfaces, wherein the light blocking portions are formed on both of the surfaces of the mask substrate, wherein at least one of the light blocking regions has concave portions and convex portions which are substantially uniformly formed, and wherein at least another one of the light blocking regions has concave portions and convex portions which are not uniformly formed.

DETAILED DESCRIPTION OF CERTAIN INVENTIVE EMBODIMENTS

Figure 1:
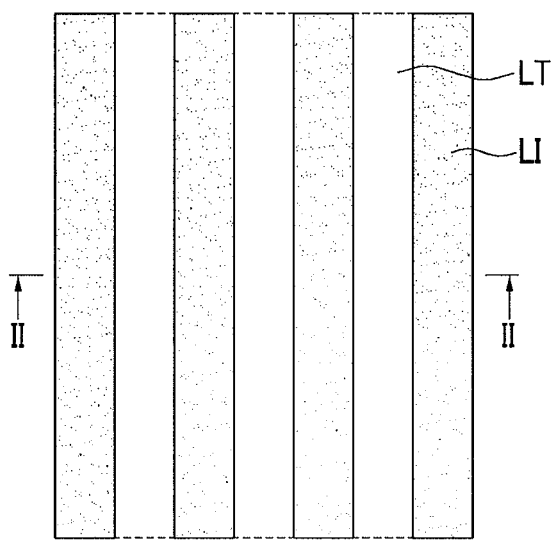
FIG. 1 is a top plan view showing a laser mask according to a first exemplary embodiment of the present invention.

An OLED includes a plurality of thin film transistors (TFTs) in which an active layer, one of constituent elements of each TFT, is made of polysilicon. In general, polysilicon includes a plurality of silicon grains crystallized from amorphous silicon. Interfaces between neighboring silicon grains act as obstacle elements to a current flow. When the size of the plurality of silicon grains constituting the polysilicon is small, the interfaces between neighboring silicon grains acting as the obstacle elements to the current flow increase.

A sequential lateral solidification (SLS) crystallization technique has been developed to increase the size of silicon grains based on the fact that the silicon grains constituting polysilicon grow in a substantially perpendicular direction from the interface between liquid silicon and solid silicon.

According to the SLS crystallization technique, the silicon grains can grow laterally by a certain length by properly adjusting the energy size, an irradiation range, and a movement distance of a laser beam irradiated to amorphous silicon through a laser mask, thereby crystallizing the amorphous silicon such that it is close to single crystalline silicon.

That is, the SLS crystallization technique involves crystallizing amorphous silicon by irradiating a laser beam to the amorphous silicon through a laser mask. In this case, the employed laser mask includes a light transmission portion allowing the laser beam to transmit therethrough, and a light interruption portion interrupting the laser beam.

However, the laser beam radiated to the amorphous silicon through the laser mask after being oscillated by a laser apparatus is reflected from the amorphous silicon. Further, the reflected laser beam is re-reflected from the laser mask and is thus continuously re-irradiated to an undesired portion of the amorphous silicon, causing defective crystallization at the undesired portion of the amorphous silicon. That is, as the laser beam is reflected from the laser mask and the amorphous silicon, it is canceled out, interfered with, and compensated to cause a difference in crystallization of the amorphous silicon.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In describing the exemplary embodiments of the present invention, the same reference numerals are used for elements having the same constructions and that are representatively described in a first exemplary embodiment of the present invention, and in other remaining exemplary embodiments of the present invention, only different constructions from those of the first exemplary embodiment will be described. The size and thickness of each element are arbitrarily shown in the drawings, and the present invention is not necessarily limited thereto.

In the drawings, the thickness of layers, films, panels, regions, etc., are exaggerated for clarity. Also, in the drawings, the thickness of some layers and regions are exaggerated for the sake of brevity. It will be understood that when an element such as a layer, film, region, or substrate is referred to as being "on" another element, it can be directly on the other element or intervening elements may also be present.

Hereinafter, a sequential lateral solidification (SLS) crystallization method will be described as a typical amorphous silicon crystallization method, but without being limited thereto, a laser mask according to an exemplary embodiment of the present invention can be employed for any crystallization method in which a laser beam is used as crystallization means.

A laser mask 101 according to a first exemplary embodiment of the present invention will now be described with reference to FIGS. 1 and 2. FIG. 1 is a top plan view showing a laser mask according to a first exemplary embodiment of the present invention.

As shown in FIG. 1, the laser mask 101 is used as a laser mask of a laser apparatus. For example, it is used for an SLS crystallization method. The laser mask 101 includes a light transmission portion LT and a light interruption portion LI.

The light transmission portion LT extends in one direction, and when the laser mask 101 is used as a laser mask of a laser apparatus, a laser beam transmits through the light transmission portion LT.

The light interruption portions LI are positioned with the light transmission portion interposed therebetween (i.e., alternately formed). When the laser mask 101 is used as a laser mask of the laser apparatus, the laser beam is interrupted or blocked by the light interruption portions LI. The light interruption portion LI interrupts or blocks a portion of the laser beam so that the width of the laser beam is reduced to the width of the light transmission portion LT.

Figure 2:
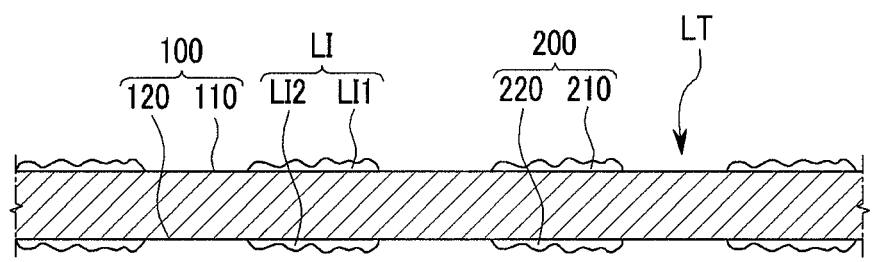
FIG. 2 is a cross-sectional view taken along line II-II in FIG. 1.

FIG. 2 is a cross-sectional view taken along line II-II in FIG. 1. The laser mask 101 further includes a base substrate 100 and protrusion and depression regions 200.

The base substrate 100 includes a first face (or first surface) 110 and a second face (or second surface) 120 facing the first face 110. In one embodiment, the first and second faces 110 and 120 of the base substrate 100 have a flat planar form, a first sub-light interruption portion LI1 is positioned on the first face 110, and a second sub-light interruption portion LI2 is positioned on the second face 120. The first sub-light interruption portion LI1 and the second sub-light interruption portion LI2 constitute the above-mentioned light interruption portion LI.

In one embodiment, the base substrate 100 is made of transparent quartz, and the portion positioned between neighboring light interruption portions LI serves as the light transmission portion LT.

In one embodiment, as shown in FIG. 2, the protrusion and depression region 200 is positioned on the base substrate 100 such that it corresponds to the light interruption portion LI, and has a concavo-convex shape (or concave and convex portions alternately formed with respect to each other). In one embodiment, the protrusion and depression region 200 is integrally formed with the light interruption portion LI and is made of chromium (Cr). That is, the light interruption portion LI may also be made of chromium (Cr).

The protrusion and depression region 200 includes a first sub-protrusion and depression region 210 and a second sub-protrusion and depression region 220. The first sub-protrusion and depression region 210 corresponds to (or is formed on) the first sub-light interruption portion LI1, and the second sub-protrusion and depression region 220 corresponds to (or is formed on) the second sub-light interruption portion LI2. In one embodiment, as shown in FIG. 2, the first and second sub-protrusion and depression regions 210 and 220 have concave portions and convex portions which are not uniformly formed, and accordingly, the first or second sub-protrusion and depression region 210 or 220 serves to diffuse a laser beam irradiated thereto with their concavo-convex shape. The diffusion function of the protrusion and depression region 200 will be described later. The protrusion and depression region 200 may be formed on the base substrate 100 through photolithography using a half-tone mask such as a semi-transmission mask, a slit mask, and the like.

In this manner, the laser mask 101 according to the first exemplary embodiment of the present invention is used for the SLS crystallization method. Further, the laser mask 101 may have the function of restraining defective crystallization of amorphous silicon, which is an irradiation subject of a laser beam, by using its diffusion function.

The SLS crystallization method using the laser mask 101 according to the first exemplary embodiment of the present invention will now be described with reference to FIGS. 3 to 7. In the SLS crystallization method using the laser mask 101 according to the first exemplary embodiment of the present invention, an eximer laser beam having energy density of a Gaussian profile is used.

Figure 3:
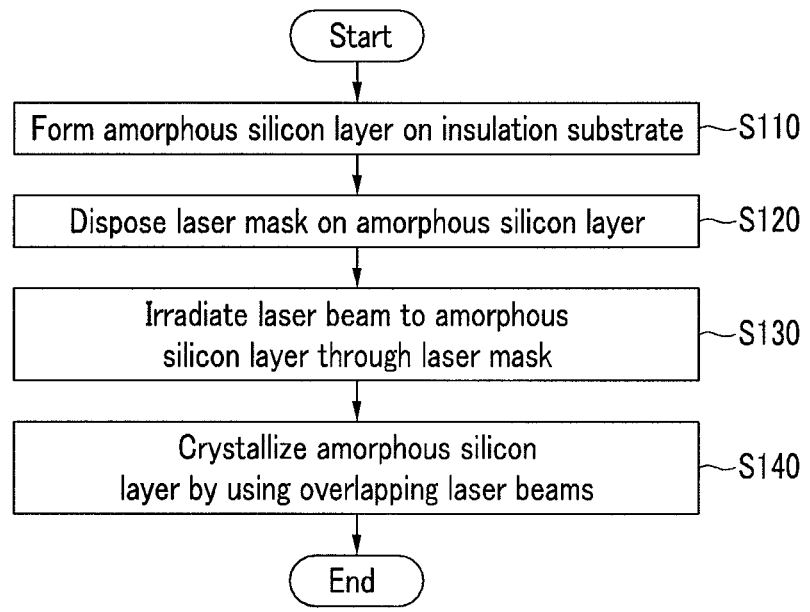
FIG. 3 is a flowchart illustrating the process of a sequential lateral solidification (SLS) crystallization method using a laser mask according to the first exemplary embodiment of the present invention.

FIG. 3 is a flowchart illustrating the process of an SLS crystallization method using a laser mask according to the first exemplary embodiment of the present invention. FIGS. 4 to 7 are views for explaining the SLS crystallization method using a laser mask according to the first exemplary embodiment of the present invention.

Figure 4:
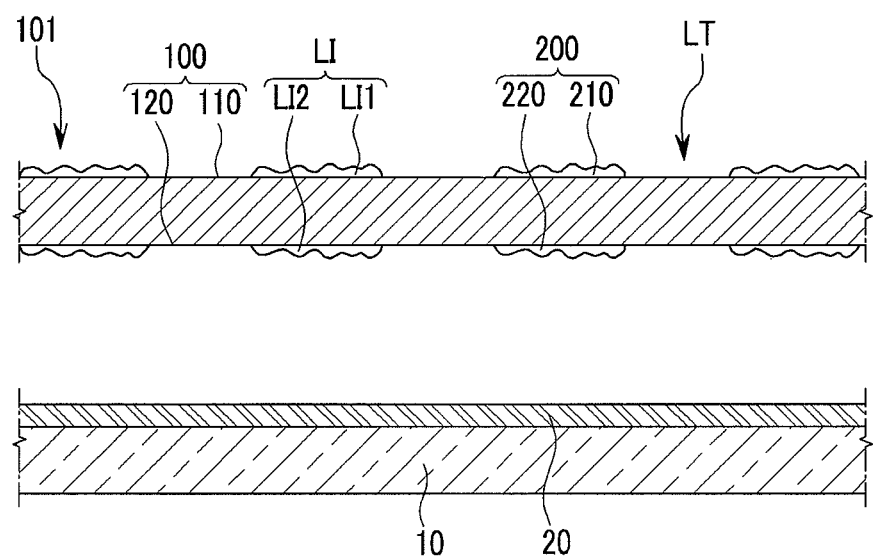
FIGS. 4 to 7 are views for explaining the SLS crystallization method using a laser mask according to the first exemplary embodiment of the present invention.

First, as shown in FIGS. 3 and 4, an amorphous silicon layer 20 is formed on an insulation substrate 10 (S110). The amorphous silicon layer 20 is deposited on the insulation substrate 10. A buffer layer may be formed between the insulation substrate 10 and the amorphous silicon layer 20, and in this case, a silicon oxide film SiOx or a silicon nitride film SiNx may be formed as the buffer layer.

Next, the laser mask 101 is disposed on the amorphous silicon layer 20 (S120). In one embodiment, after the laser mask 101 is disposed on the amorphous silicon layer 20, the laser mask 101 is aligned on the amorphous silicon layer 20 such that the light transmission portion LT of the laser mask 101 corresponds to an area that is intended to be crystallized of the entire area of the amorphous silicon layer 20.

Figure 5:
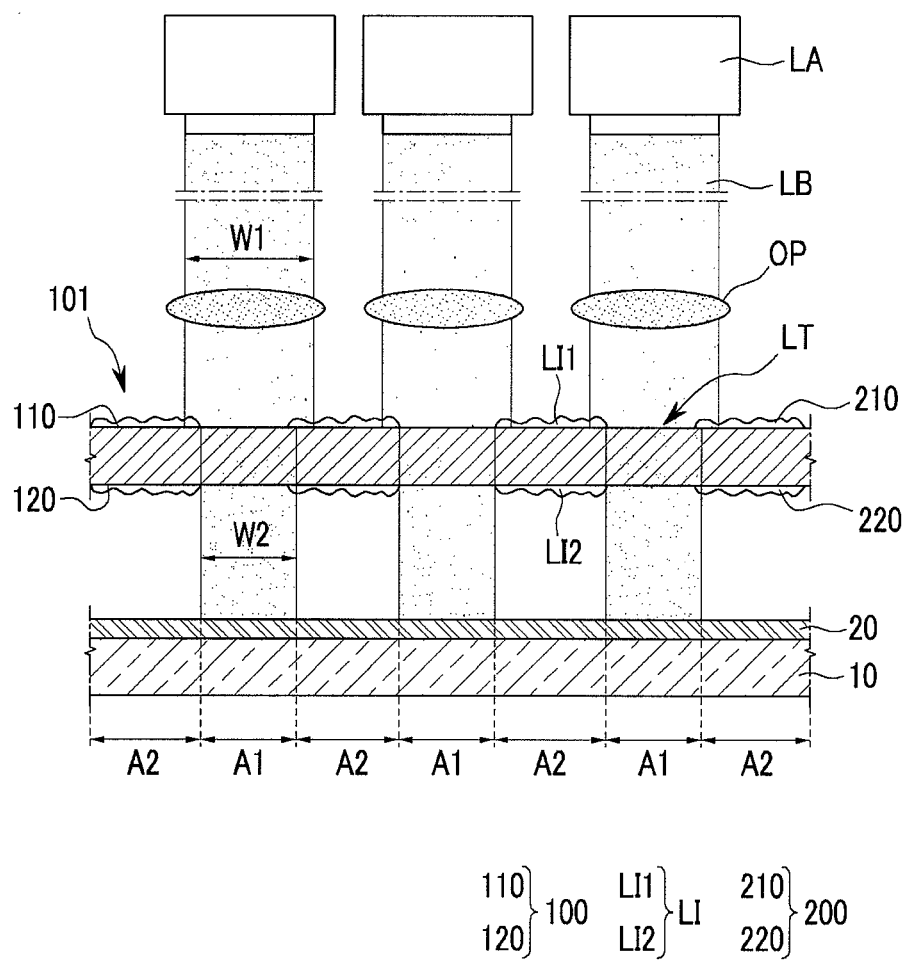

Then, as shown in FIG. 5, a laser beam (LB) is irradiated to the amorphous silicon layer 20 through the laser mask 101 (S130). In one embodiment, the laser beam LB oscillated from the laser apparatus (LA) is irradiated to the amorphous silicon layer 20 through an optical system (OP) such as a lens or the like, and the laser mask 101. In this case, the laser beam (LB) having a first width W1 and that is originally oscillated from the laser apparatus (LA) is partially interrupted by the light interruption (LI) portion. Further, as the laser beam (LB) passes through the light transmission (LT) portion, it has a second width W2, and the laser beam (LB) with the second width W2 is irradiated to the amorphous silicon layer 20. The laser beam (LB) is irradiated to a first area A1 that is intended to be crystallized of the amorphous silicon layer 20, and a second area A2 positioned between neighboring first areas A1 is a region that is to be crystallized later or that is not crystallized.

Here, when the laser beam (LB) transmits through the laser mask 101, a portion of the laser beam (LB) is reflected from the laser mask 101 toward the optical system (OP). Also, when the laser beam (LB) is irradiated to the amorphous silicon layer 20, a portion of the laser beam (LB) is reflected from the amorphous silicon layer 20 toward the laser mask 101 and is then re-reflected from the laser mask 101 so as to be re-irradiated to the amorphous silicon layer 20. In this manner, the laser beam (LB) reflected by the laser mask 101 and the amorphous silicon layer 20 is diffused by the protrusion and depression region 200 of the laser mask 101. This will be described in detail hereinbelow.

Figure 6:
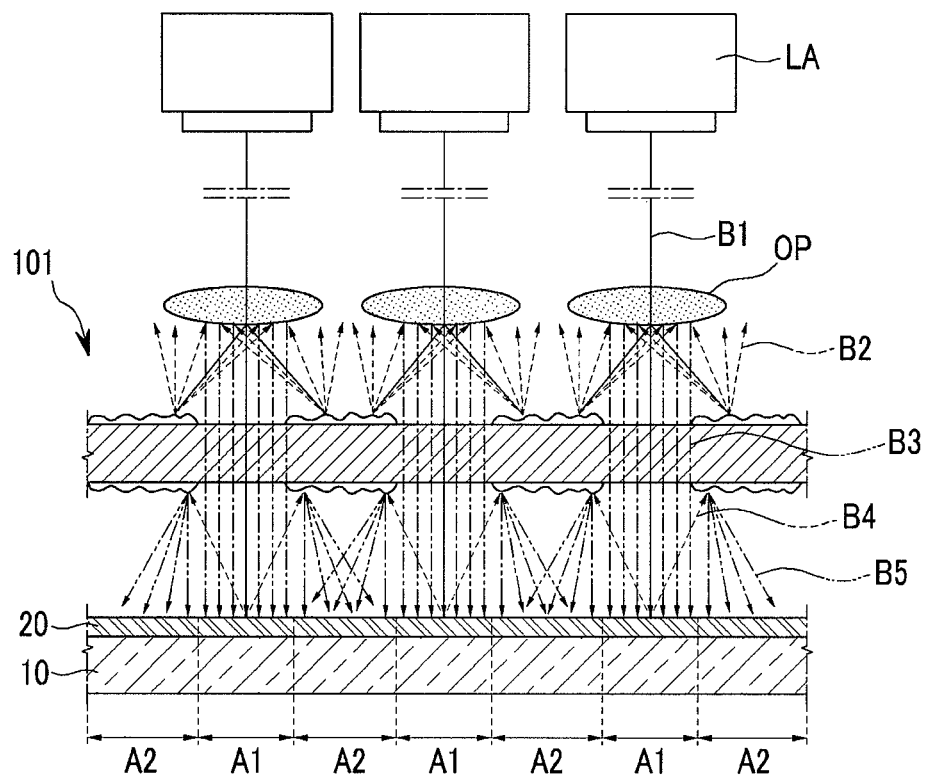

FIG. 6 is a view for explaining a path of the laser beam through the laser mask according to the first exemplary embodiment of the present invention. As shown in FIG. 6, a first beam B1 (indicated by a solid line) initially oscillated from the laser apparatus (LA) is irradiated to the amorphous silicon layer 20 through the optical system (OP) and the laser mask 101. In this case, the first beam B1 (indicated by the solid line) reflected by the first sub-protrusion and depression region 210 corresponding to the first sub-light interruption portion LI1 positioned on the first face 110 of the laser mask 101 is diffused by the first sub-protrusion and depression region 210 and converted into a second diffusion beam B2 (indicated by dotted lines) so as to be irradiated toward the optical system (OP). Thereafter, the second diffusion beam B2 (indicated by dotted lines) is reflected by the optical system (OP) so as to be converted into a third diffusion beam B3 (indicated by alternated long and short dash lines) and irradiated to the first area A1 of the amorphous silicon layer 20 through the light transmission portion LT of the laser mask 101.

Although the third diffusion beam B3 (indicated by the alternated long and short dash lines) is an undesired laser beam (LB), because it is diffused (e.g., spread to weakened multiple beams) by the first sub-protrusion and depression region 210 so as to be substantially evenly irradiated to the entirety of the first area A1 of the amorphous silicon layer 20. Since the beam is significantly weakened by the diffusion, it does not cause a defective crystallization at an undesired portion of the first area A1 of the amorphous silicon layer 20.

In addition, the first beam B1 (indicated by the solid line) irradiated to the amorphous silicon layer 20 through the light transmission portion LT of the laser mask 101 after being initially oscillated from the laser apparatus (LA) is reflected by the amorphous silicon layer 20. The reflected beam is converted into a fourth reflection beam B4 (indicated by dotted lines) and irradiated toward the second sub-protrusion and depression region 220 corresponding to the second sub-light interruption portion LI2 positioned on the second face 120 of the laser mask 101. Thereafter, the fourth reflection beam B4 (indicated by the dotted lines) is reflected and diffused at the same time by the second sub-protrusion and depression region 220 so as to be converted into a fifth diffusion beam B5 (indicated by alternated long and short dash lines) and irradiated to the second area A2 of the amorphous silicon layer 20.

Although the fifth diffusion beam B5 (indicated by the alternated long and short dash lines) is an undesired laser beam (LB) irradiated to the undesired portion, that is, to the second area A2 of the amorphous silicon layer 20, it does not cause defective crystallization at the second area A2 of the amorphous silicon layer 20. This is because it is diffused by the second sub-protrusion and depression region 220 so as to be substantially evenly irradiated to the entirety of the second area A2 of the amorphous silicon layer 20. In particular, in a case where the second area A2 of the amorphous silicon layer 20 is to be crystallized later, the second area A2 can be crystallized when intended within a short time because molecules of the amorphous silicon layer 20 are maintained in an excited state by the fifth diffusion beam B5 (indicated by the alternated long and short dash lines).

In this manner, even when the laser beam (LB) oscillated from the laser apparatus (LA) is reflected by the optical system (OP) through the laser mask 101 so as to be irradiated to the first area A1 of the amorphous silicon layer 20, the LB is reflected upon being diffused by the first and second sub-protrusion and depression regions 210 and 220, thus restraining undesired defective crystallization with respect to the amorphous silicon layer 20. The same applies when the laser beam (LB) is reflected by the amorphous silicon layer 20 and then re-reflected by the laser mask 101 so as to be irradiated to the second area A2 of the amorphous silicon layer 20.

Figure 7:
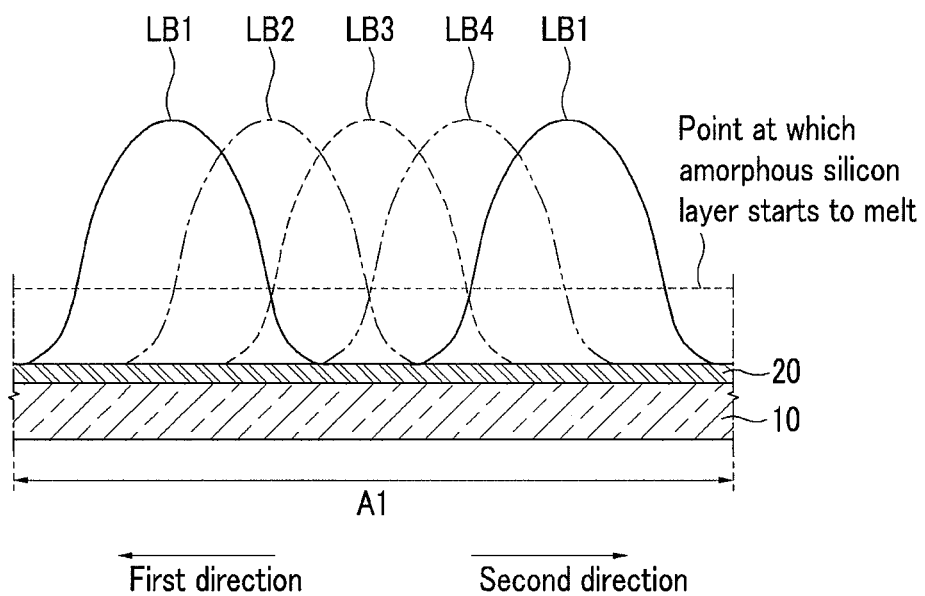

Thereafter, as shown in FIG. 7, the amorphous silicon layer 20 is crystallized by using overlapping laser beams (LB). FIG. 7 illustrates the overlapping degree of laser beams in the SLS crystallization method using the laser mask 101 according to the first exemplary embodiment of the present invention.

In FIG. 7, the curved lines indicate profiles regarding energy density of laser beams in the first area A1 of the amorphous silicon layer 20 where the laser beams overlap each other, for the sake of brevity.

In one embodiment, the amorphous silicon layer 20, the laser beam (LB), and the laser mask 101 are relatively moved in order to irradiate first laser beams (LB1) on the insulation substrate 10 with the amorphous silicon layer 20 formed thereon such that they are spaced apart. Further, second, third, and fourth laser beams LB2, LB3, and LB4 are irradiated to the portion between the neighboring first laser beams LB1 such that they overlap by a certain interval with each other. In one embodiment, the neighboring laser beams (LB) overlap with each other at an area having a higher energy density than that of the energy density start point at which the amorphous silicon layer 20 melts. The overlapping of the laser beams (LB) by a certain interval based on the first laser beam (LB1) results from the movement of the position of the insulation substrate 10 corresponding to the light transmission portion LT of the laser mask 101 as the insulation substrate 10 is moved in a first direction in the drawing. Through such SLS crystallization method, the amorphous silicon constituting the amorphous silicon layer 20 is crystallized such that it is close to single crystal silicon in a second direction.

That is, through the processes as stated above, the amorphous silicon of the amorphous silicon layer 20 can be crystallized to be close to single crystal silicon, and defective crystallization otherwise generated from an undesired position can be restrained.

In one embodiment, although the laser beam (LB) oscillated from the laser apparatus (LA) is reflected by the optical system (OP) and the laser mask 101 and thus irradiated to an undesired position of the amorphous silicon layer 20, undesired defective crystallization of the amorphous silicon layer 20 can be restrained. This is because the laser beam (LB) reflected by the optical system (OP) or the laser mask 101 is diffused by the protrusion and depression region 200 of the laser mask 101 so as to be substantially uniformly irradiated to the amorphous silicon layer 20.

Figure 8:
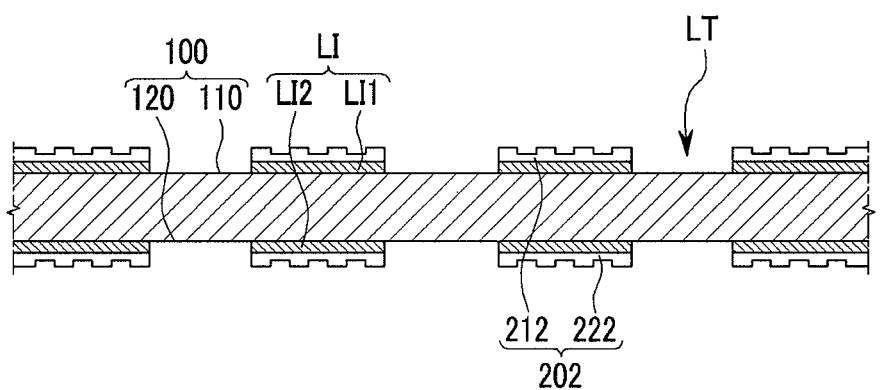
FIG. 8 is a cross-sectional view of a laser mask according to a second exemplary embodiment of the present invention.

A laser mask 102 according to a second exemplary embodiment of the present invention will now be described with reference to FIG. 8. FIG. 8 is a cross-sectional view of a laser mask according to a second exemplary embodiment of the present invention.

As shown in FIG. 8, a light interruption portion LI of the laser mask 102 includes first and second sub-light interruption portions LI1 and LI2 made of chromium (Cr). The first and second sub-light interruption portions LI1 and LI2 serve to set the width of the laser beam (LB) transmitting through the laser mask 102 after being oscillated from the laser apparatus (LA).

A protrusion and depression region 202 includes a heat-resistant resin, and includes a first sub-protrusion and depression region 212 positioned on the first sub-light interruption portion LI1 and a second sub-protrusion and depression region 222 positioned on the second sub-light interruption portion LI2.

In one embodiment, as shown in FIG. 8, the first and second sub-protrusion and depression regions 212 and 222 have concave portions and convex portions which are substantially uniformly (or evenly) formed, and accordingly, the first or second sub-protrusion and depression region 212 or 222 serve to diffuse the laser beam irradiated thereto with their concavo-convex shape. With the set concavo-convex shape, the first and second sub-protrusion and depression regions 212 and 222 may set the direction of the laser beam (LB) that is reflected upon being diffused by the first or second sub-protrusion and depression regions 212 or 222. In detail, because the first and second sub-protrusion and depression regions 212 and 222 set the irradiation position of the laser beam (LB) irradiated to the amorphous silicon layer 20 after being reflected by the first and second sub-protrusion and depression regions 212 and 222, the laser beam (LB) can be irradiated uniformly to the entire amorphous silicon layer 20.

The protrusion and depression region 202 of the laser mask 102 according to the second exemplary embodiment of the present invention may be formed on the base substrate 100 through a printing technique using a stamp made of PDMS (polydimethylsiloxane) or the like.

In one embodiment, although the laser beam (LB) that is oscillated from the laser apparatus (LA) is reflected by the optical system (OP) and the laser mask 102 and thus irradiated to an undesired position of the amorphous silicon layer 20, undesired defective crystallization of the amorphous silicon layer 20 can be restrained. This is because the laser beam (LB) reflected by the optical system (OP) or the laser mask 102 is diffused by the protrusion and depression region 202 of the laser mask 102 so as to be substantially uniformly irradiated to the amorphous silicon layer 20.

Figure 9:
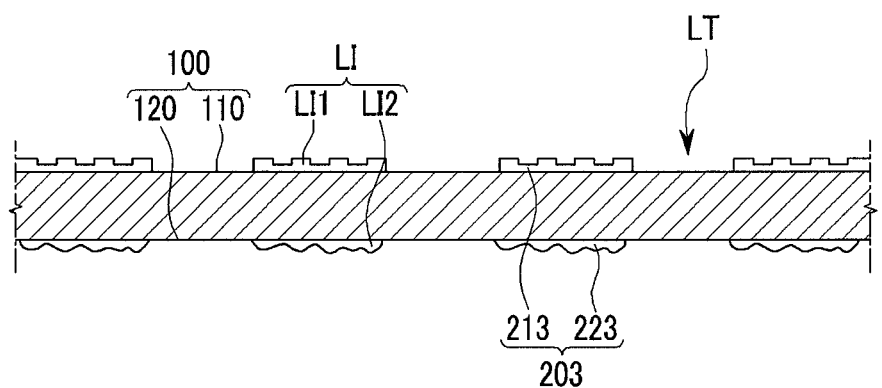
FIG. 9 is a cross-sectional view of a laser mask according to a third exemplary embodiment of the present invention.

A laser mask 103 according to a third exemplary embodiment of the present invention will now be described with reference to FIG. 9. FIG. 9 is a cross-sectional view of the laser mask according to the third exemplary embodiment of the present invention.

In one embodiment, as shown in FIG. 9, a light interruption portion L1 of the laser mask 103 is integrally formed with a protrusion and depression region 203. In one embodiment, as shown in FIG. 9, a first sub-protrusion and depression region 213 corresponding to a first sub-light interruption portion LI1 of the light interruption portion L1 has concave and convex portions which are substantially uniformly (or evenly) formed. In one embodiment, a second sub-protrusion and depression region 223 corresponding to a second sub-light interruption portion LI2 of the light interruption portion LI has concave and convex portions which are not uniformly (or not evenly) formed.

Although the laser beam (LB) oscillated from the laser apparatus (LA) is reflected by the optical system (OP) and the laser mask 103 and is thus irradiated to an undesired position of the amorphous silicon layer 20, undesired defective crystallization of the amorphous silicon layer 20 can be restrained. This is because the laser beam (LB) reflected by the optical system (OP) or the laser mask 103 is diffused by the protrusion and depression region 203 of the laser mask 103 so as to be substantially uniformly irradiated to the amorphous silicon layer 20.

Figure 10:
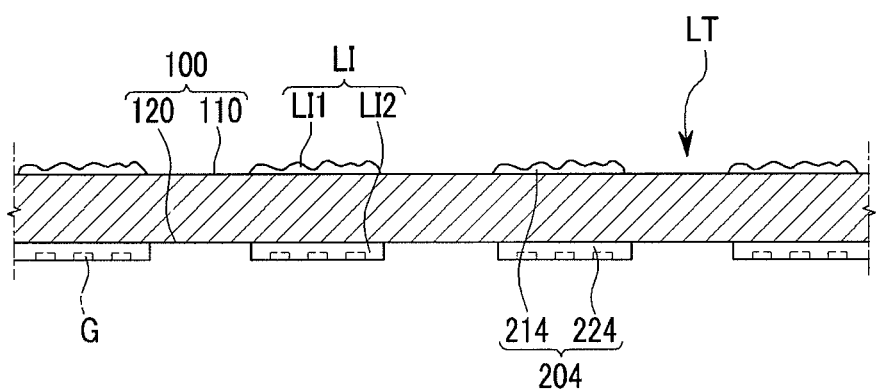
FIG. 10 is a cross-sectional view of a laser mask according to a fourth exemplary embodiment of the present invention.

A laser mask 104 according to a fourth exemplary embodiment of the present invention will now be described with reference to FIG. 10. FIG. 10 is a cross-sectional view of a laser mask according to a fourth exemplary embodiment of the present invention.

In one embodiment, as shown in FIG. 10, a light interruption portion LI of the laser mask 104 is integrally formed with a protrusion and depression region 204. In one embodiment, as shown in FIG. 10, a first sub-protrusion and depression region 214 corresponding to a first sub-light interruption portion LI1 of the light interruption portion L1 has concave portions and convex portions which are not uniformly (or not evenly) formed. In one embodiment, as shown in FIG. 10, a second sub-protrusion and depression region 224 corresponding to a second sub-light interruption portion LI2 of the light interruption portion LI has concave and convex portions which are substantially uniformly (or evenly) formed.

The second sub-protrusion and depression region 224 includes a recess (G) formed on its flat planar surface. The recess (G) may be formed by patterning an anti-reflection layer with the flat planar surface of the second sub-protrusion and depression region 224.

As described above, with the laser mask 104 according to the fourth exemplary embodiment of the present invention, although the laser beam (LB) oscillated from the laser apparatus (LA) is reflected by the optical system (OP) and the laser mask 104 and is thus irradiated to an undesired position of the amorphous silicon layer 20, because the laser beam (LB) reflected by the optical system (OP) or the laser mask 104 is diffused by the protrusion and depression region 204 of the laser mask 104 so as to be substantially uniformly irradiated to the amorphous silicon layer 20, undesired defective crystallization of the amorphous silicon layer 20 can be restrained.

According to exemplary embodiments of the present invention, a laser mask that is capable of restraining a difference in crystallization of amorphous silicon, and a sequential lateral solidification (SLS) crystallization method using the same, can be provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A laser mask comprising:
   a mask substrate comprising i) at least one light transmission portion configured to transmit light therethrough and ii) a plurality of light interruption portions separated by the light transmission portion interposed therebetween, wherein the light interruption portions are configured to block light; and
   a plurality of protrusion and depression regions positioned on the light interruption portions of the mask substrate, wherein each of the protrusion and depression regions comprises a plurality of concave portions and a plurality of convex portions which are alternately formed.

2. The laser mask of claim 1, wherein the mask substrate further comprises a base substrate having a first surface and a second surface opposing each other, wherein the light interruption portions are positioned on at least one of the first and second surfaces of the base substrate.

3. The laser mask of claim 2, wherein the first sub-protrusion and depression region is formed directly above the first sub-interruption portion, and wherein the first sub-protrusion and depression region and the first sub-interruption portion have substantially the same width.

4. The laser mask of claim 3, wherein the second sub-protrusion and depression region is formed directly below the first sub-interruption portion, and wherein the second sub-protrusion and depression region and the second sub-interruption portion have substantially the same width.

5. The laser mask of claim 2, wherein each of the light interruption portions comprises a first sub-interruption portion positioned on the first surface of the base substrate and a second sub-interruption portion positioned on the second surface of the base substrate, wherein each of the protrusion and depression regions comprises a first sub-protrusion and depression region formed on the first sub-interruption portion and a second sub-protrusion and depression region formed on the second sub-interruption portion, and wherein the first sub-interruption portion and the second sub-protrusion and depression region are substantially directly opposing each other with respect to the base substrate.

6. The laser mask of claim 5, wherein each of the light interruption portions is formed of chromium (Cr).

7. The laser mask of claim 6, wherein each of the protrusion and depression regions is formed of chromium (Cr).

8. The laser mask of claim 6, wherein each of the protrusion and depression regions is integrally formed with the corresponding light interruption portion.

9. The laser mask of claim 8, wherein each of the light interruption portions is formed of a heat-resistant resin.

10. The laser mask of claim 5, wherein one of the first and second sub-protrusion and depression regions comprises concave portions and convex portions which are substantially uniformly formed, and wherein the other comprises concave portions and convex portions which are not uniformly formed.

11. The laser mask of claim 5, wherein the first and second sub-protrusion and depression regions comprise concave portions and convex portions which are substantially uniformly formed.

12. The laser mask of claim 5, wherein the first and second sub-protrusion and depression regions comprise concave portions and convex portions which are not uniformly formed.

13. The laser mask of claim 5, wherein the base substrate is formed of quartz.

14. The laser mask of claim 1, wherein the mask is used for a sequential lateral solidification (SLS) crystallization method.

15. The laser mask of claim 1, wherein the at least one light transmission portion comprises a plurality of light transmission portions, and wherein the light transmission portions and light interruption portions are substantially evenly spaced apart.

16. A laser mask comprising:
- a mask substrate comprising i) a plurality of light transmission portions configured to transmit light therethrough and ii) a plurality of light blocking portions configured to block light, wherein the light transmission portions and light blocking portions are spaced apart and alternately formed; and
- a plurality of protrusion and depression regions positioned on the light blocking portions of the mask substrate, wherein each of the protrusion and depression regions comprises a plurality of concave portions and a plurality of convex portions which are alternately formed and are configured to diffuse at least part of incoming light.

17. The laser mask of claim 16, wherein the mask substrate comprises two opposing surfaces, wherein the protrusion and depression regions are formed on both of the surfaces of the mask substrate, wherein at least one of the protrusion and depression regions has concave portions and convex portions which are substantially uniformly formed, and wherein at least another one of the protrusion and depression regions has concave portions and convex portions which are not uniformly formed.

* * * * *